United States Patent [19]

Suzuki

[11] Patent Number: 4,985,346
[45] Date of Patent: Jan. 15, 1991

[54] PHOTO AND HEAT SENSITIVE RECORDING MEDIUM AND IMAGE RECORDING METHOD

[75] Inventor: Kouji Suzuki, Kasugai, Japan

[73] Assignee: Brother Kogyo Kabushiki Kaisha, Nagoya, Japan

[21] Appl. No.: 315,436

[22] Filed: Feb. 23, 1989

[30] Foreign Application Priority Data

Mar. 16, 1988 [JP] Japan .................................. 63-62809

[51] Int. Cl.$^5$ ............................................... G03C 5/16
[52] U.S. Cl. ..................................... 430/350; 430/253; 430/254; 430/293; 430/348; 430/351
[58] Field of Search ................. 430/254, 253, 293, 20, 430/3, 48, 350, 351

[56] References Cited

U.S. PATENT DOCUMENTS 4,356,253 11/1982 Buzzel .................................. 430/293
4,391,894 7/1983 Shimazu et al. ..................... 430/293
4,587,198 5/1986 Fisch .................................... 430/293
4,734,356 3/1988 Bauer et al. .......................... 430/293
4,739,338 4/1988 Tanaka et al. ....................... 430/348

Primary Examiner—Paul R. Michl
Assistant Examiner—Thorl Chea
Attorney, Agent, or Firm—Kane, Dalsimer, Sullivan, Kurucz, Levy, Eisele and Richard

[57] ABSTRACT

A photo and heat sensitive recording medium has a front side coated with a layer of photo-curable composition which has photo-curability and heat fusibility in an uncured state. In an image recording method, the recording medium is exposed to light on the basis of image information, to photo-cure light-illuminated areas of the layer of photo-curable composition. Subsequently, the recording medium is superimposed upon a side of a subject being transferred. The superimposed recording medium and subject are heated to transfer an image corresponding to uncured areas on the recording medium, onto the side of the subject.

1 Claim, 1 Drawing Sheet

PHOTO AND HEAT SENSITIVE RECORDING MEDIUM AND IMAGE RECORDING METHOD

BACKGROUND OF THE INVENTION

This invention relates to a photo and heat sensitive recording medium for recording an optical image, and an image recording method employing the recording medium.

Various image recording media and various image recording methods using the recording media are known conventionally. One of the known methods is such that an image is recorded onto a photo and pressure sensitive recording medium. Specifically, a latent image corresponding to image information on an original is formed, by exposure to light, onto a microcapsule sheet having carried thereon microcapsules each of which contains photo-curable resin including dye precursor. Then, a developer sheet is superimposed upon the microcapsule sheet. The developer sheet is coated with developer agent which can react with the dye precursor to develop color. Subsequently, pressure is applied to the superimposed microcapsule sheet and developer sheet, to destroy the uncured microcapsules. The dye precursor squeezed out of the ruptured microcapsules reacts with the developer agent on the developer sheet to develop color. Thus, an image corresponding to the latent image on the microcapsule sheet is recorded onto the developer sheet.

Another one of the known methods is such that an image is recorded onto an ordinary sheet of paper by the use of a wet ribbon. Specifically, a ribbon impregnated with photo-curable composition is pressurized by an impact head to transfer image information to a subject being transferred, to form an image corresponding to the image information onto the subject. Then, the subject is exposed to light to cure the photo-curable composition, thereby fixing the image on the subject.

Still another one of the known methods is such that an image is recorded by the use of screen printing. Specifically, a screen plate having carried thereon image information is employed to print photo-curable composition onto a subject being transferred, to form an image onto the subject. Subsequently, the subject is exposed to light to cure the photo-curable composition, thereby fixing the image on the subject.

However, there is yet room for improvement in the above-described conventional methods. That is, the method employing the photo and pressure sensitive recording medium has such a problem that, because of the pressure sensitivity, scratches or the like tend to be formed on the front side of the recording medium so that the image quality is damaged. The method using the wet ribbon has such a problem that, because of the impact system, transfer of an image having complicated outlines is difficult. Furthermore, the method due to the screen printing has such a problem that production of the screen plate for the photo-curable composition results in an increase in the cost.

SUMMARY OF THE INVENTION

It is therefore an object of this invention to provide an improved photo and heat sensitive recording medium capable of minimizing inadvertent scratching of an image, and capable of clearly depicting an image having fine or minute outlines.

It is another object of the invention to provide an image recording method utilizing the recording medium, capable of achieving image recording at low cost.

For the above purpose, according to the invention, there is provided a photo and heat sensitive recording medium having a front side coated with a layer of photo-curable composition having photo-curability and having heat fusibility in an uncured state.

Preferably, the photo-curable composition is a mixture of at least dye and photo-curable resin. If black dye is used, there is provided a monochromatic image. Further, if photo-curable compositions are prepared, which contain cyan dye, magenta dye and yellow dye, respectively, there is provided a mixed color image by an image recording method subsequently to be described.

According to the invention, there is also provided an image recording method, which comprises the steps of:

preparing a photo and heat sensitive recording medium having a front side coated with a layer of photo-curable composition having photo-curability and having heat fusibility in an uncured state;

exposing the recording medium to light on the basis of image information, to photo-cure light-illuminated areas of the layer of photo-curable composition;

subsequently, superimposing the recording medium upon a side of a subject being transferred; and heating the superimposed recording medium and subject to transfer an image corresponding to uncured areas on the recording medium, onto the side of the subject.

BRIEF DESCRIPTION OF THE ACCOMPANYING DRAWINGS

FIG. 1 is an exaggerated cross-sectional view of a photo and heat sensitive recording medium embodying the invention, showing an exposure state; and FIG. 2 is an exaggerated side elevational view of the recording medium illustrated in FIG. 1, showing a transfer state.

DESCRIPTION OF THE EMBODIMENT

Figure 1:
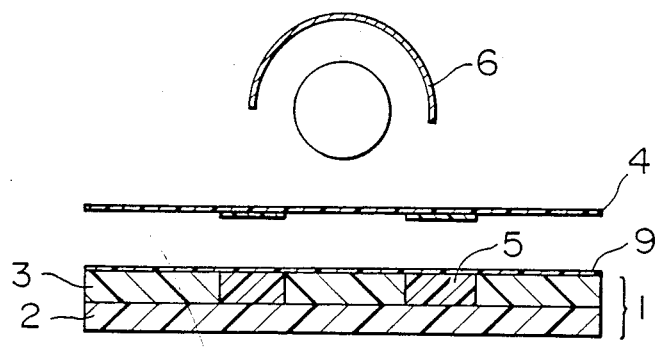

Referring to FIG. 1, there is shown in exaggerated cross-section a photo and heat sensitive recording medium 1 embodying the invention. The recording medium 1 comprises a substrate 2 and a layer 3 of photo-curable composition coated on one side of the substrate 2.

The substrate 2 is made of resinous material such as polyethylene, polycarbonate, polyester, polyamide or the like. The substrate 2 may be made of any suitable material other than those mentioned above, if the material can carry thereon the photo-curable composition. The photo-curable composition consists primarily of photo-polymerization initiator, photo-curable resin monomer and dye. The photo-curable composition may contain pigment, filler, photo-sensitizer, binder polymer and so on in addition to those mentioned above. The photo-curable resin monomer is used, which has heat fusibility in a state not photo-cured. In this connection, a release layer (not shown) made of silicone resin or the like may be interposed between the substrate 2 and the photo-curable composition layer 3, in order to obtain superior releasability or separability of the photo-curable composition layer 3.

There are various exposure ways such as reflecting type, transmitting type, electric-signal type and so on. Any one of these exposure ways can be applied to the recording medium 1 for exposing the same to light to form a latent image 5 onto the recording medium 1. The latent image corresponds to image information on an original 4 such as a transparent film or the like. The photo-sensitive wavelength is 450 nm in case where the photo-curable composition contains cyan dye, the photo-sensitive wavelength is 550 nm in case of magenta dye, and the photo-sensitive wavelength is 650 nm in case of yellow dye. In view of this fact, a light source 6 should be able to emit light which can cover the entire range of from 300 nm to 700 nm. For example, a tungsten lamp, a halogen lamp or the like can be utilized as the light source 6.

Figure 2:
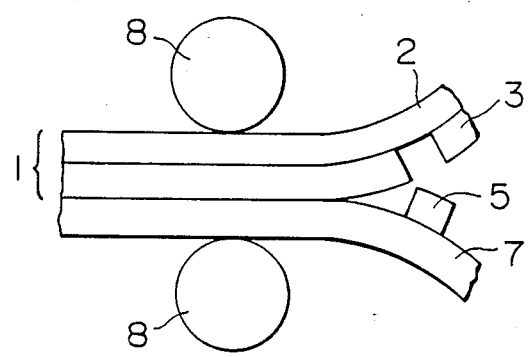

The recording medium 1 having carried thereon the latent image 5 is superimposed upon a subject being transferred 7, as shown in FIG. 2. The superimposed recording medium and subject 1 and 7 are then heated by a heat source 8 such as, for example, a pair of heat rollers. Uncured parts of the photo-curable composition layer 3 corresponding to the latent image 5 are fused and are transferred to the subject 7. However, cured parts of the photo-curable composition layer 3 cannot be fused by the heat from the heat source 8 and, therefore, are not transferred to the subject 7. Thus, an image corresponding to the image information on the original 5 is recorded onto the subject 7. The heat source 8 may be in the form of a plate. In this connection, it is desirable that the heat source 8 can cover a temperature range of from 40° C. to 200° C.

(EXAMPLE NO. 1)

Photo-curable composition was used with contained photo-curable resin monomer, photo-polymerization initiator and dye. The photo-curable resin monomer consisted of 40 parts of trimethylolpropane triacrylate and 30 parts of 2,2-diphenylene diethylene glycol propane diacrylate. The photo-polymerization initiator consisted of 3 parts of diethyl thioxanthone and 3 parts of 4-methyl thioether-2-methyl-2-morphoril propiophenon. The dye contained 0.3 parts of C.I. solvent black 3. The photo-curable composition was coated on a polyester film of 25 μm in thickness. Thus, a photo and heat sensitive recording medium 1 was obtained. For the purpose of prevention of sticking and contamination, a protective film 9 of 3.5 μm in thickness and superior in separability was applied to the coated side of the recording medium 1. An original 4 constituted by a transparent film having carried thereon image information was set between the recording medium 1 and the light source 6, and was exposed to light from the light source 6 for one minute. In this manner, a latent image corresponding to the image information was formed onto the recording medium 1. The protective film 9 was then stripped from the recording medium 1. Subsequently, a subject being transferred 7 was superimposed upon the coated side of the recording medium 1. The superimposed subject and recording medium 7 and 1 were then caused to pass between a nip between a pair of heat rollers serving as a heat source 8, to transfer latent-image parts onto the subject 7 from the recording medium 1. Finally, the subject 7 having carried thereon the latent-image parts was exposed to light for the purpose of fixing, so that an image corresponding to the image information on the original 4 is recorded onto the recording medium 1. The thus obtained image was very excellent.

(EXAMPLE NO. 2)

Photo-curable compositions A, B and C were prepared. The photo-curable composition A contained photo-curable resin monomer, photo-polymerization initiator and dye. The photo-curable resin monomer consisted of 40 parts of trimethylolpropane triacrylate and 30 parts of 2,2-diphenylene diethylene glycol propane diacrylate. The photo-polymerization initiator consisted of 3 parts of diethyl thioxanthone and 3 parts of 4-methyl thioether-2-methyl-2-morphoril propiophenon. The dye contained 0.1 part of C.I. basic red 12. The photo-curable composition B contained photo-polymerizable resin monomer, photo-polymerization initiator and dye. The photo-polymerizable resin monomer consisted of 40 parts of pentaerythritol triacrylate, and 30 parts of 2,2-diphenylene diethylene glycol propane diacrylate. The photo-polymerization initiator consisted of 3 parts of 2,4,6-tris(trichloromethyl)-1,3,5-triazine, and 3 parts of 3,3-carbonyl-bis (coumarin). The dye consisted of 0.1 part of C.I. basic yellow 11. The photo-curable composition C contained photo-polymerizable resin monomer, photo-polymerization initiator and dye. The photo-polymerizable resin monomer consisted of 40 parts of trimethylolpropane triacrylate and 30 parts of 1,3-hexanediol diacrylate. The photo-polymerization initiator consisted of 5 parts of 2-phenyl-2,2-dihydroxyacetophenone dimethyl ether. The dye consisted of 0.1 part of C.I. basic blue. These three photo-curable compositions A, B and C were used in a manner like that described with reference to Example No. 1, to obtain three kinds of photo and heat sensitive recording media A, B and C. A color image was decomposed into yellow, magenta and cyan, and was read out to send respective signals to a liquid crystal panel. When image information of the magenta appeared on the liquid crystal panel, the recording medium A coated with the photo-curable composition A was superimposed upon the liquid crystal panel, and was exposed to light. Light transmitting areas other than the image information of the magenta on the recording medium A were photocured, whereby a latent image on the basis of the image information of the magenta color was obtained. Likewise, when image information of the yellow appeared on the liquid crystal panel, the recording medium B was superimposed upon the liquid crystal panel and was exposed to light to obtain a latent image. Further, when image information of the cyan appeared on the liquid crystal panel, the recording medium C was superimposed upon the liquid crystal panel and was exposed to light to obtain a latent image. A subject being transferred 7 was superimposed upon the coated side of the recording medium A having carried thereon the latent image. Then, the superimposed subject and recording medium 7 and A were pressed against each other by an iron at 150° C., thereby transferring the image of the magenta onto the subject 7. The subject 7 was then exposed to light for the purpose of fixing. Subsequently, the recording medium B was superimposed upon the subject 7, while being maintained so as not to shift from the image of the magenta, to carry out transfer and fixing. Transfer and fixing were effected with respect also to the recording medium C in a manner like that described above. The thus obtained image on the subject 7 bore comparison with the original color image.

As will be apparent from the foregoing, the photo and heat sensitive recording medium coated with the photo-curable composition, according to the invention, has the following advantages. That is, no scratch is inadvertently formed on the front side of the recording medium, unlike the photo and pressure sensitive recording medium. Further, the recording medium according to the invention is easy in handling, and can obtain an image which is minimized in scratch. Since, moreover, an image is recorded onto the recording medium on the basis of the photo and heat sensitive system, fine or minute outlines appear clearly, unlike the impact head system, whereby there is provided an image superior in quality. Since, furthermore, an image can be obtained easily by the photo and heat sensitive system, the cost can be reduced as compared with the screen printing system.

What is claimed is:

1. An image recording method, which comprises the steps of:
   providing a photo and heat sensitive recording medium having a front side coated with a layer of a photo-curable composition, said layer also having heat fusibility in an uncured state but non-heat fusibility in a cured state;
   exposing said recording medium to light providing image information, to photo-cure light-illuminated areas of said layer of photo-curable composition to form a latent image of said image information on said layer;
   superimposing said recording medium and a developing medium upon which a visible image of said image information is desired so that said front side contacts said recording medium; and
   heating the superimposed recording medium and developing medium to transfer the heat fusible uncured portions of said layer whereby a visible image corresponding to said image information is developed on said developing medium.

* * * * *